(12) United States Patent
Kojima et al.

(10) Patent No.: US 7,183,497 B2
(45) Date of Patent: Feb. 27, 2007

(54) MULTILAYER WIRING BOARD

(75) Inventors: Toshifumi Kojima, Aichi (JP); Makoto Wakazono, Gifu (JP)

(73) Assignee: NGK Spark Plug Co., Ltd. (JP)

( * ) Notice: Subject to any disclaimer, the term of this patent is extended or adjusted under 35 U.S.C. 154(b) by 0 days.

(21) Appl. No.: 11/012,326

(22) Filed: Dec. 16, 2004

(65) Prior Publication Data

US 2005/0126818 A1 Jun. 16, 2005

(30) Foreign Application Priority Data

Dec. 16, 2003 (JP) ............................. 2003-417497

(51) Int. Cl.
*H05K 1/16* (2006.01)
*H01R 12/04* (2006.01)

(52) U.S. Cl. ...................... 174/262; 174/264

(58) Field of Classification Search ............... 174/255, 174/260, 262, 256, 257, 258, 259, 261, 264, 174/266, 265; 361/760, 792, 793, 794, 795, 361/767, 768, 779

See application file for complete search history.

(56) References Cited

U.S. PATENT DOCUMENTS

| | | | |
|---|---|---|---|
| RE34,982 E * | 6/1995 | Prabhu et al. ............... | 501/19 |
| 6,010,768 A | 1/2000 | Yasue et al. | |
| 6,193,910 B1 | 2/2001 | Ikai et al. | |
| 6,217,988 B1 | 4/2001 | Yasue et al. | |
| 6,251,502 B1 | 6/2001 | Yasue et al. | |
| 6,350,365 B1 * | 2/2002 | Koyama et al. ............ | 205/125 |
| 6,376,049 B1 | 4/2002 | Asai et al. | |
| 6,376,052 B1 | 4/2002 | Asai et al. | |
| 6,828,510 B1 * | 12/2004 | Asai et al. ................. | 174/255 |
| 6,930,258 B1 * | 8/2005 | Kawasaki et al. .......... | 174/264 |
| 2005/0236177 A1 * | 10/2005 | Inagaki et al. .............. | 174/255 |

FOREIGN PATENT DOCUMENTS

| | | |
|---|---|---|
| JP | 09-181415 | 7/1997 |
| JP | 10-075027 | 3/1998 |
| JP | 11-186729 | 7/1999 |
| JP | 11-199759 | 7/1999 |
| JP | 2000-323843 | 11/2000 |
| JP | 2002-134921 | 5/2002 |

* cited by examiner

*Primary Examiner*—Ishwar Patel
(74) *Attorney, Agent, or Firm*—Stites & Harbison PLLC; Ross F. Hunt, Jr.

(57) ABSTRACT

A multilayer wiring board (11) is provided which includes a core substrate (12) including a plurality of through-holes (15). The through-holes (15) include through-hole conductors (17) on the inner walls of corresponding penetration holes (16) of a diameter of 200 μm or less. Interlayer insulating layers (31, 32) are disposed on opposite sides of the principal planes (13, 14) of the core substrate (12). Wiring layers (23, 24) are disposed on the surface of interlayer insulating layers (31, 32). The through-holes (15) are filled with a hardened filling material (18). Lid conductors (21, 22) close the openings of the through-holes (15). The value of linear expansion of the hardened filling material (18) is 1.2% or less in the temperature region from room temperature to the solder reflow temperature. The board has excellent connection reliability and exhibits little or no cracking or delamination in the lid conductor closing the openings of the through-holes and in the surrounding conductor area.

19 Claims, 4 Drawing Sheets

FIG.2
Table 1

| Filling material | Epoxy resin (parts by weight) | | Curing agent (parts by weight) | Filler (parts by weight) | Viscosity of filling material(Pa.S) | Linear expansion of hardened matter of filling material(%) | Mean coefficient of thermal expansion of hardened matter of filling material(ppm/k) |
|---|---|---|---|---|---|---|---|
| F1 | E807 (63) | E630 (33) | DICY7 (4) | f2(190) f3(30) | 65 | 0.98 | 24 |
| F2 | E630 (65) | E807 (30) | 2MAZ (5) | f3(135) | 60 | 0.95 | 38 |
| F3 | E630 (63) | E828 (62) | 2MAZ (5) | f1(300) | 45 | 1.21 | 44 |
| F4 | E828 (50) | E807 (45) | 2MAZ (5) | F2(120) f3(15) | 80 | 1.29 | 33 |

FIG.3
Table 2

| Core substrate | Linear expansion of core substrate(%) | Mean coefficient of thermal expansion of core substrate(ppm/k) | Difference of mean coefficient of thermal expansion to TH plating(ppm/k) | Filing material | Difference of mean coefficient of thermal expansion to filling material(ppm/k) | Difference of linear expansion to core substrate(%) |
|---|---|---|---|---|---|---|
| A | 1.05 | 30 | 14 | F1 | 6 | 0.1 |
| | | | | F2 | 5 | 0.1 |
| | | | | F3 | 14 | -0.2 |
| | | | | F4 | 3 | -0.2 |
| B | 1.02 | 23 | 7 | F1 | 1 | 0.0 |
| C | 1.49 | 45 | 31 | F1 | 21 | 0.5 |
| | | | | F4 | 12 | 0.2 |

Mean coefficient of thermal expansion of through-hole plating is 16 ppm/K

FIG.4

Table 3

| Sample No. | Core substrate | Filling material | Printability | | | Reliability: occurrence rate of crack, delamination | | |
|---|---|---|---|---|---|---|---|---|
| | | | TH diameter 100 µm | TH diameter 200 µm | TH diameter 300 µm | TH diameter 100 µm | TH diameter 200 µm | TH diameter 300 µm |
| 1 | A | F1 | ○ | ○ | ○ | 0% | 0% | 0% |
| 2 | A | F2 | ○ | ○ | ○ | 0% | 0% | 0% |
| 3 | A | F3 | ○ | ○ | ○ | 58% | 6% | 0% |
| 4 | A | F4 | △ | △ | △ | 95% | 47% | 0% |
| 5 | B | F1 | ○ | ○ | ○ | 0% | 0% | 0% |
| 6 | C | F1 | △ | - | - | 30% | - | 0% |
| 7 | C | F4 | △ | - | - | 35% | - | 0% |

Printability
○ Excellent
△ Additional printing required due to insufficient filling

MULTILAYER WIRING BOARD

BACKGROUND OF THE INVENTION

1. Field of the Invention

The present invention relates to a multilayer wiring board having through-holes of small diameter, wherein the through-holes filled with hardened filling material, and openings of the through-holes are closed with lid conductors.

2. Description of the Related Art

Along with the recent trend in the art to smaller size and higher performance electronic appliances, there is the demand that the mounting density of electronic components be higher. To achieve such high density mounting, the use of the multilayer forming technology for wiring boards is important. A specific example of this multilayer forming technology is known as a multilayer wiring board, in which interlayer insulating layers and wiring layers are alternately laminated to form a built-up layer on one side or both sides of a core substrate having through-holes of about 300 μm in diameter.

When manufacturing such multilayer wiring board, in order to assure a flat built-up layer, through-holes must be preliminarily filled up with a filler material, such as a through-hole filling paste, which should be heated and cured. Several methods have been proposed for filling up through-holes (see, for example, Japanese Laid-open Patent Publication No. H10-75027 and Japanese Laid-open Patent Publication No. H11-199759). The first reference discloses a technique for preventing cracks in the interlayer insulating layer by filling through-holes using a resin filling material specified as to the resin component and type of curing agent. The second reference discloses a technique for preventing cracks in the interlayer insulating layer by filling through-holes using a filling material having a characteristic shrinkage rate of a hardened material.

SUMMARY OF THE INVENTION

As indicated above, there has been an increasing demand for higher mounting densities. One way to achieve this is to use smaller diameter through-holes, and the number of instances in which through-holes of smaller diameter are formed has been increasing. However, if the diameter of the through-holes is smaller than 200 μm, problems not experienced before have been noted. More specifically, as schematically shown in FIG. 5, wherein a portion of a multilayer wiring board is shown which includes a lid plating layer 103 for a through-hole 102 including a through-hole plating portion 105 and a hardened filler material 101, delamination, indicated at 107, is likely to occur at the interface of (i) the lid plating layer 103 used for closing the opening of the through-hole 102 filled with hardened filling material 101 and (ii) a via 106 located immediately thereabove. Because of this, it is difficult to provide a high reliability connection. In addition, deformations or cracks 107 can form at the interface of lid plating layer 103 and through-hole plating portion 105, and/or cracks, indicated at 104, can form in the lid plating layer 103 itself. This also makes it hard to provide a high reliability connection.

The present invention is concerned with addressing the above-discussed problems, and it is hence an object thereof to provide a multilayer wiring board having excellent connection reliability, with minimal cracking or delamination in the lid conductor for filling the openings of through-holes and in the surrounding conductor area.

To solve the problems, the present inventors have carried out intensive studies, and although the invention is not bound by any particular theory, have theorized as discussed below about the mechanism responsible for the occurrence of delamination or cracking in the lid conductor covering the openings of the through-holes and in the surrounding conductor area.

In multilayer wiring board manufacturing process, it is usual, after fabricating a wiring board by a single or plural steps of solder reflow, that the wiring board is evaluated by various tests (appearance evaluation test and others) before a final product is obtained. Incidentally, the hardened filler material expands thermally because of the heating and cooling process of solder reflow. In particular, through expansion in Z-axis direction of the hardened filling material (that is, in thickness direction of wiring board, and the axial direction of through-hole), the hardened filler material pushes up the lid conductor positioned at the opening of the through-hole, and a compressive or tensile stress is applied to the lid conductor or its surrounding conductor area. When the wiring board is evaluated by applying a thermal impact to such an existing state of compressive or tensile strength, and in particular, when the through-hole is small in diameter, cracking or delamination is likely to occur in the lid conductor positioned at this opening or in the surrounding conductor area. In support of this theory, the inventors have observed the properties of the hardened filler material, and especially the value of thermal expansion, and have found that cracking or delamination can be effectively prevented by optimizing the value of thermal expansion. In further developing this finding, the inventors have ultimately discovered a solution to the aforementioned problems, as described below.

To solve one or more of the problems discussed above, there is provided, in accordance with one aspect of the invention, a multilayer wiring board comprising a core substrate having a first principal plane and a second principal plane, and a plurality of through-holes, each comprising a penetration hole including an inner wall and having a diameter of 200 μm or less and a through-hole conductor provided on the inner wall of the penetration hole opening at both the first principal plane and second principal plane; an interlayer insulating layer disposed at least on one side of at least one of the first principal plane and the second principal plane of the core substrate; a wiring layer disposed on the surface of the interlayer insulating layer; a hardened filling material filling the through-holes; and a lid conductor closing one end of the through-holes, wherein the hardened filling material has a value of linear expansion that is no greater than 1.2% in a temperature region from room temperature to the solder reflow temperature.

Therefore, according to this aspect of the invention, the value of the linear expansion of the hardened filling material is reduced to a very low value of 1.2% or less in the temperature region from room temperature to the solder reflow temperature. Hence, at the time of solder reflow, the amount of thermal expansion of the hardened filling material is quite small, and any compressive or tensile stress existing in the lid conductor or its surrounding conductor area is also quite small. Therefore, when the connection reliability is evaluated using thermal impact testing, there is little or no cracking or delamination in the lid conductor or its surrounding conductor area, so that a high connection reliability is realized.

In accordance with this aspect of the invention, the value of linear expansion of the hardened filling material is 1.20% or less (excluding 0%) in the temperature region from room temperature to solder reflow temperature, and is more preferably between 0.30% and 1.20%, or is most preferably between 0.80% 1.20%. If the value of linear expansion exceeds 1.20%, the amount of thermal expansion of the hardened filling material cannot be sufficiently reduced, and the occurrence rate of cracking or delamination is not sufficiently low. On the other hand, if the value of linear expansion is less than 0.30%, the hardened filling material becomes stiff, and the hardened filling material itself may crack, or the through-hole conductor may become cracked.

In accordance with this aspect of the invention, the term linear expansion refers to the elongation (%) of material measured over a temperature range from room temperature (25° C.) to the solder reflow temperature by means of a TMA (thermomechanical analysis apparatus) by using the hardened filling material used in making the multilayer wiring board. When selecting a tin-lead eutectic solder (Sn/37Pb: melting point 183° C.) as the solder material to be used as a constituent element of the multilayer wiring board, the solder reflow temperature is set at the reflow temperature (for example, 215° C.) of the tin-lead eutectic solder. Thus, the reflow temperature is a temperature higher than the solder melting point by about 30° C. in this particular case. Further, by using a Sn/Pb solder system other than a tin-lead eutectic solder, for example, the solder in the composition of Sn/36Pb/2Ag (melting point 190° C.), a similar solder reflow temperature may be determined.

Solder materials usable as constituent elements of multilayer wiring board may include, aside from a solder containing lead, a lead-free solder. A lead-free solder is a solder containing very little or no lead, and examples include a Sn—Ag system solder, a Sn—Ag—Cu system solder, a Sn—Ag—Bi system solder, a Sn—Ag—Bi—Cu system solder, a Sn—Zn system solder, and a Sn—Zn—Bi system solder. It is noted that the solder materials of these systems may include trace elements (such as Au, Ni, Ge, etc.).

Specific examples of Sn—Ag system solders include a solder having a composition of Sn/3.5Ag (melting point 221° C.) and a solder having a composition of Sn/3Ag/ 6–8In. Specific examples of Sn—Ag—Cu system solders include a solder having a composition of Sn/3.0Ag/0.5Cu (melting point 217° C.). Specific examples of Sn—Ag—Bi system solders include a solder having a composition of Sn/3.5Ag/0.5Bi/3.0In (melting point 214° C.), and a solder having a composition of Sn/3.2Ag/2.7Bi/2.7In (melting point 210° C.). Specific examples of Sn—Ag—Bi—Cu system solders include a solder having a composition of Sn/2.5Ag/1.0Bi/0.5Cu (melting point 214° C.). Specific examples of Sn—Zn system solders include a solder having a composition of Sn/9.0Zn (melting point 199° C.). Specific examples of Sn—Zn—Bi system solder include solder in a composition of Sn/8Zn/3Bi (melting point 198° C.).

The linear expansion of the hardened filling material is preferably measured in the hardened filling material actually applied in the through-hole, but the result obtained by a simplified method explained below may also be used in determining linear expansion.

In this simplified method, a thermosetting filling material is first poured into a molding space of about 10 mm×10 mm×50 mm, and the filling material is thermally cured under the same conditions as in a conventional or ordinary process. Then, by using a lathe or other machine, a circular columnar test piece of 20 mm in diameter of 5 mm is fabricated, and this sample is measured by the TMA method mentioned above. The TMA method is a thermomechanical analysis method as specified in, for example, JIS K 7197 (Testing method of linear thermal expansion by thermomechanical analysis of plastics). While applying a compressive load of about 1 g in the longitudinal direction of the test piece at a span of 20 mm, the test piece is first cooled to −55° C., and then heated up to 215° C. at a heating rate of 10° C./min. In this process, at 25° C. and 215° C., the length of the test piece is measured, and the measured results so obtained are used in equation 1 below to calculate the value of linear expansion (%). When measuring the linear expansion of the core substrate, the core substrate, before forming the through-holes, may be properly cut off, and test pieces may be obtained.

$$\epsilon b = (L_{215} - L_{25})/L_{25} \times 100 \qquad \text{Equation 1}$$

wherein
$\epsilon b$: linear expansion (%);
$L_{215}$: sample length at 215° C. (mm); and
$L_{25}$: sample length at room temperature (25° C.) (mm)

The value of the mean coefficient of thermal expansion in the axial direction (i.e., in Z-axis direction) of the hardened filling material is preferably between 5 ppm/K and 50 ppm/K, and, more preferably, between 20 ppm/K and 40 ppm/K. The value of the mean coefficient of thermal expansion in the axial direction of the hardened filling material is preferably as close as possible to the mean coefficient of thermal expansion in the thickness direction (Z-axis direction) of the core substrate, and, more specifically, the absolute value of the difference between the two is preferably 20 ppm/K or less. The reason for this is because the stress applied to the through-hole conductor or the like is reduced at the time of the reliability evaluation test when the absolute value of the difference between the two is 20 ppm/K or less. More preferably, the absolute value of the difference between the two should be 10 ppm/K or less.

The mean coefficient of thermal expansion of the hardened filling material can be measured using the following method. First, a circular columnar test piece of 20 mm in diameter of 5 mm is fabricated from the filling material in the method mentioned above, and this sample is measured by TMA method. As indicated above, the TMA method is a thermomechanical analysis, as specified in, for example, JIS K 7197 (Testing method of linear thermal expansion by thermomechanical analysis of plastics). While applying a compressive load of about 1 g in the thickness direction of the test piece at a span of 20 mm, the test piece is first cooled to −55° C., and then heated up to 215° C. at a heating rate of 10C/min. In this process, at −55° C., 25° C. and 125° C., the length of test piece is measured, and the measured results so obtained are used in equation 2 below to calculate the value of mean coefficient of thermal expansion (ppm/K). When measuring the mean coefficient of thermal expansion of core substrate, the core substrate before forming through-holes may be properly cut off to obtain test pieces.

$$\alpha = \{(L_{125} - L_{55})/(L_{25} \times (125 - (-55)))\} \qquad \text{Equation 2}$$

wherein
$\alpha$: mean coefficient of thermal expansion (ppm/K);
$L_{125}$: sample length at 125° C. (mm);
$L_{55}$: sample length at −55° C. (mm); and
$L_{25}$: sample length at room temperature (25° C.) (mm).

The absolute value of the difference between the mean coefficient of thermal expansion in the Z-axis direction of the hardened filling material and the mean coefficient of thermal expansion in the Z-axis direction of through-hole conductor is preferably 20 ppm/K or less, and, more preferably, 15 ppm/K or less. The absolute value of the difference between the mean coefficient of thermal expansion in the thickness direction of the core substrate and the mean coefficient of thermal expansion in the Z-axis direction of the through-hole conductor is preferably 30 ppm/K or less, and, more preferably, 25 ppm/K or less. In any event, by decreasing the absolute value of the difference, it is possible to decrease the stresses applied to the through-hole conductor, lid conductor, and interlayer insulating layer at the time of the reliability evaluation test.

In addition, the mean coefficient of thermal expansion in the Z-axis direction of the interlayer insulating layer is preferably between 20 ppm/K and 60 ppm/K, and, more preferably, between 20 ppm/K and 55 ppm/K. If the mean coefficient of thermal expansion exceeds 60 ppm/K, the thermal expansion is increased at the time of the reliability evaluation test, and stresses are applied to the wiring layer or via pad, and cracks are likely to be formed. On the other hand, if the mean coefficient of thermal expansion is less than 20 ppm/K, the interlayer insulating layer becomes stiff, so that it is difficult to sufficiently fill up the gap of the wiring layer, and/or cracks may be formed in the interlayer insulating layer.

Core substrates usable in preferred embodiments of the invention include a resin substrate, ceramic substrate, and metal substrate, and, in particular, a resin substrate is preferred. Preferred examples of a resin substrate include substrates made of EP resin (epoxy resin), PI resin (polyimide resin), BT resin (bismaleimide-triazine resin), PPE resin (polyphenylene ether resin), etc. In addition, these resins may be combined with glass fiber (glass woven cloth or glass nonwoven cloth), and a composite material may be used as substrate. Specific examples include glass-BT composite substrate, high Tg glass-epoxy composite substrate (FR4, FR-5, etc.) and other high heat resistant laminated substrate. In addition, these resins and polyamide fiber or other organic fiber may be combined. Other substrates may be formed by using continuous porous PTFE or other three-dimensional reticular fluoroplastic resin base material impregnated with epoxy resin or thermosetting resin to form substrate of a resin-resin composite material. In general, the core substrate preferably exhibits a low value of linear expansion or low value of mean coefficient of thermal expansion, and in this respect, it is preferable to use a high heat resistant laminated board or the like. Further, a core substrate having a wiring layer inside may also be used.

When using a resin board as core substrate, it is preferred to select a material containing a powder or fibrous inorganic filler agent. Such inorganic filler agents include ceramic filler, metal filler, and glass filler. Preferred ceramic fillers include silica, alumina, calcium carbonate, aluminum nitride, aluminum hydroxide, titania, barium sulfate, and the like. When the inorganic material is contained in a resin, the values of linear expansion and mean coefficient of thermal expansion are lowered, and heat resistance is enhanced.

The core substrate preferably has a through-hole structure having a through-hole conductor provided on the inner wall of a penetration hole that opens on both the first principal plane and second principal plane. The through-hole conductor is preferably formed by disposing a conductive metal on the inner wall of the through-hole. In a preferred embodiment, the through-hole plating portion or part is formed by depositing an electroless copper plating on the inner wall of the penetration hole, as this is preferable from the viewpoints of ease of manufacture and lower cost. The value of thermal expansion in the thickness direction of the core substrate is preferably between 0.3% and 1.4% in a temperature range from room temperature to the reflow temperature, and more preferably between 0.8% and 1.3%.

The surface of the through-hole conductor is preferably substantially free of any undulations, and, more specifically, the smoothness thereof is preferably Ra<1 µm wherein Ra is the arithmetic mean roughness specified in JIS B 0601-1994. For example, when filling the penetration hole by printing a filling material by adding a filler to the resin, if there are undulations, the resin is concentrated in this portion. Hence, the resin content of the filler increases closer to the exit end of the penetration hole, and the viscosity of the filling material increases substantially, with an adverse effect on the filling property of the material. Even if the penetration hole can be filled up with the filling material, thermal expansion of the material differs between the inlet and exit portions of the penetration hole because of non-uniformity of the material. Hence, cracking is likely to occur in the hardened filling material.

In preferred embodiments of the invention, the through-hole is smaller in diameter than is conventional in the prior art, and, in particular, the through-hole conductor is preferably formed in a penetration hole of 200 µm or less in diameter (excluding, of course, 0 µm). The reason for this is that problems such as cracking or delamination in the lid conductor closing the opening of the through-hole and its surrounding conductor area become more evident when the diameter of penetration hole is less than 200 µm, i.e., the problems to be solved by the invention actually occur when the diameter of penetration hole is 200 µm or less. In the case of a through-hole of small diameter, the specific reason for the occurrence of the problems sought to be solved by the invention is not clear, but as compared with a through-hole of a conventional size, the stress on the lid conductor is larger, and this is thought to be a cause. The diameter of the penetration hole may be 100 µm or less (again excluding 0 µm).

The filling material used in preferred embodiments of the invention preferably has a high heat resistance, and, in particular, a high glass transition point is desired. Generally, when exceeding the glass transition point, the mean coefficient of thermal expansion increases, and the linear expansion is high in a filling material of a low glass transition point. The glass transition point is preferably 140° C. or more, and, more preferably, 150° C. or more. The filling material is preferably formed principally by a resin material having a thermosetting property, and the material is cured after being charged into the through-hole. The filling material is preferably formed mainly of epoxy resin. The epoxy resin generally exhibits a small curing shrinkage, and is less likely to form recess at the end thereof even after curing.

Among the epoxy resins, it is preferable to use an aromatic epoxy having excellent heat resistance, humidity resistance, and chemical resistance, and candidate epoxies include, for example, a bisphenol A type epoxy resin, bisphenol F type epoxy resin, phenol novolak type epoxy resin, and cresol novolak type epoxy resin. Further, it is effective to use an epoxy resin (aminophenol type) of multifunctional type, i.e., having three functions or more, from the viewpoint of reducing linear expansion.

The filling material is preferably formed by using an epoxy resin and adding a curing agent providing a thermosetting property. Such curing agents include an imidazole hardening agent, dicyan diamide, and other amine hardening agents having excellent heat resistance and chemical resistance. The properties of curing agents are not particularly critical, but a curing agent in powder form is advantageous in extending the life of the curing agent after preparation.

The filling material preferably contains a filler having a maximum particle size of between 5 µm and 60 µm, in addition to the curing agent added to the epoxy resin. Preferably, such filler is an inorganic filler such as a ceramic filler, metal filler, and glass filler. The addition of an inorganic filler leads to a reduction of the linear expansion of hardened filling material and the mean coefficient of thermal expansion. Preferred examples of a suitable ceramic filler include silica, alumina, calcium carbonate, aluminum nitride, aluminum hydroxide, titania, barium sulfate and other particles. Preferred metal fillers include particles of copper, silver, tin, lead, titanium, iron, nickel, and the like. In another embodiment, the surface of a ceramic filler may be coated with metal particles. Both a ceramic filler and a metal filler may also be used.

The maximum particle size of the filler is preferably between 5 μm and 60 μm. If the maximum particle size is less than 5 μm, the filling material cannot be charged at high density, and it is difficult to reduce the linear expansion of the hardened filling material and the mean coefficient of thermal expansion at such low particle size values. If the maximum particle size is more than 60 μm, clogging is likely to occur when filling through-holes of a diameter of 200 μm or less with the filler material. Hence, filling with the filling material may be difficult.

When filling the through-hole, the viscosity of the filling material is preferably 300 Pa·s or less at shearing speed of $21 \text{ s}^{-1}$ at 22+/−3° C., and, more preferably, between 10 Pa·s and 200 Pa·s. If the viscosity is less than 10 Pa·s, the applied filling material may droop out of, or otherwise exude from, the through-hole. If the viscosity exceeds 200 Pa·s, the fluidity of the filling material is insufficient, and it is hard to fill the through-hole with the filling material. An appropriate method of filling the through-hole with the filler material is a printing method. In this case, the filling material may be printed using a mask, or the filling material may be directly printed without using a mask.

The filling material of the invention may contain other components in a range or amount not producing any substantial effect on the material. For example, without causing a substantial effect on the insulation or moisture resistance, additions can be made of such components as a defoaming agent, oscillating agent, coloring matter, leveling matter, coupling agent, and the like.

The interlayer insulating layer is disposed at the first principal plane side, at the second principal plane side of core substrate, or at both the first plane and second plane sides. The interlayer insulating layer is preferably formed of an epoxy resin, polyimide resin, or bismaleimide-triazine resin as the base resin, and by further adding a curing agent or the like. In such a composition, the linear expansion and mean coefficient of thermal expansion of the interlayer insulating layer can be set at low values. The interlayer insulating layer may be made of either single layer or plural layers.

A wiring layer is disposed on the surface of the interlayer insulating layer. The technique for forming the wiring layer and the metal material used may be suitably selected based on a consideration of the conductivity or adhesion with the interlayer insulating layer. Examples of metal materials that may be used in forming the wiring layer include copper, copper alloy, silver, silver alloy, nickel, nickel alloy, tin, and tin alloy. Suitable forming techniques for the wiring layer include a subtractive method, semiadditive method, full additive method, and other known methods. Specific examples include the etching of copper foil, electroless copper plating, electrolytic copper plating, electroless nickel plating, and electrolytic nickel plating. Further, a wiring layer may be formed by etching after forming a metal layer by a sputtering or CVD technique, or a wiring layer may be formed by printing with a conductive paste or the like. On the outermost layer of the interlayer insulating layer a solder resist may be disposed, as required, in order to protect the wiring layer.

In the opening of the through-hole, a lid conductor is disposed so as to close the through-hole. Such a lid conductor is preferably obtained by forming a conductor layer in the opening of the through-hole by any known method using a conductive metal. In a preferred embodiment of the lid conductor, a lid plating layer is formed by applying copper plating. The thickness of such a lid plating layer is set at, for example, between 5 μm and 50 μm, and, more preferably, between 10 μm and 30 μm.

In the interlayer insulating layer, a via may be disposed at a position on the surface of the lid conductor, and, more preferably, a filled via may be disposed by filling the via recess with a plating material. The filled via, formed by a via recess filled with a plating material, provides limited resistance against a pushing force from the through-hole and is less likely to release stress by its own plastic deformation, as compared with a via not filled with a plating material. Therefore, if the filled via is present at this position, it is likely to contribute to or exacerbate the problems sought to be solved by the invention, that is, occurrence of cracking or delamination in the lid conductor or its surrounding conductor area. The filled via is formed by creating or opening a via recess in the interlayer insulating layer, and filling the via recess with an electrolytic copper plating to substantially flatten the upper surface. More particularly, the filled via is preferably formed by opening a via recess in the interlayer insulating layer, filling the via recess with electroless copper plating, and filling the via cavity with electrolytic copper plating or a conductive paste to substantially flatten the upper surface.

In accordance with a further aspect of the invention, another approach or implementation for solving the problems discussed above involves the provision of a multilayer wiring board comprising a core substrate having a first principal plane and a second principal plane, with a through-hole conductor provided in the inner wall of a penetration hole of diameter of 200 μm or less opening on the first principal plane and the second principal plane, an interlayer insulating layer disposed at least at one side of the first principal plane or second principal plane of the core substrate, a wiring layer disposed on the surface of the interlayer insulating layer, a hardened filling material filling up the through-hole, and a lid conductor closing the opening of the through-hole, wherein the absolute value of the difference between the value of linear expansion of the hardened filling material in the temperature region from room temperature to the solder reflow temperature, and the value of linear expansion in the thickness direction of the core substrate in the temperature region from room temperature to the solder reflow temperature is 0.1% or less.

Therefore, according this aspect of the invention, the absolute value of the difference between the value of linear expansion of the hardened filling material in the temperature region from room temperature to the solder reflow temperature, and the value of linear expansion in the thickness direction of the core substrate in the same temperature region is kept at an extremely low value of 0.1% or less. Hence, in the case of solder reflow, the amount of thermal expansion of hardened filling material is quite small, and any compressive or tensile stress existing in the lid conductor or its surrounding conductor area is also quite small. Therefore, if the reliability of the wiring board is evaluated by applying a thermal impact test, little or no cracking or delamination occurs in the lid conductor or its surrounding conductor area, and a high connection reliability is realized.

BRIEF DESCRIPTION OF THE DRAWINGS

FIG. 2 is a table showing the composition and properties of a filler used in thermal impact test, in a specific example;

FIG. 3 is a table showing the properties of core substrate used in a thermal impact test, in the example of FIG. 2;

FIG. 4 is a table showing the results of the thermal impact test, in the example of FIG. 2.

DESCRIPTION OF A PREFERRED EMBODIMENT

A preferred embodiment of a multilayer wiring board in accordance with the invention is described below in reference to FIGS. 1 to 4.

Figure 1:
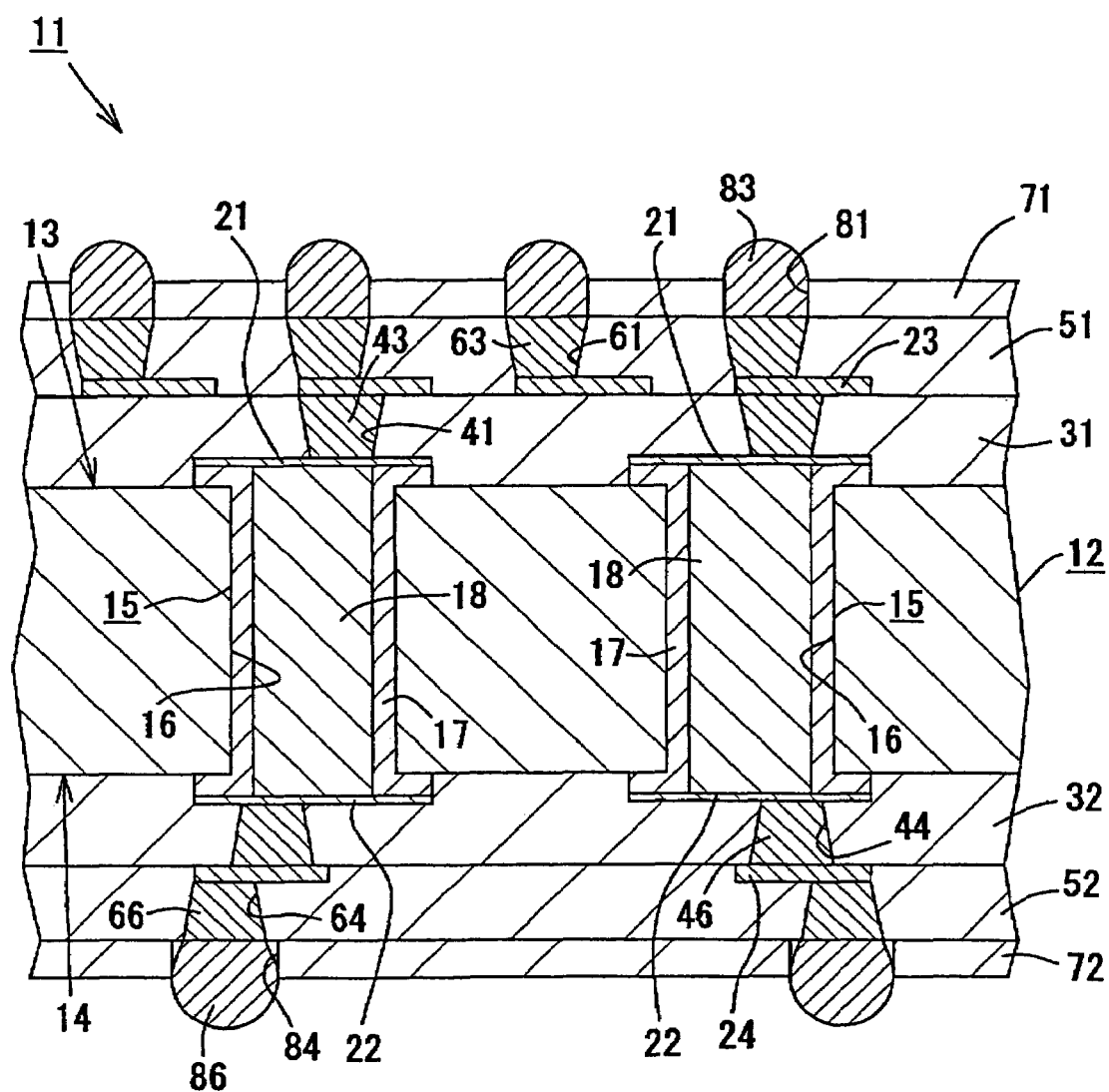
FIG. 1 is a magnified schematic cross-sectional view of essential parts of multilayer wiring board in accordance with a preferred embodiment of the invention.
Figure 5:
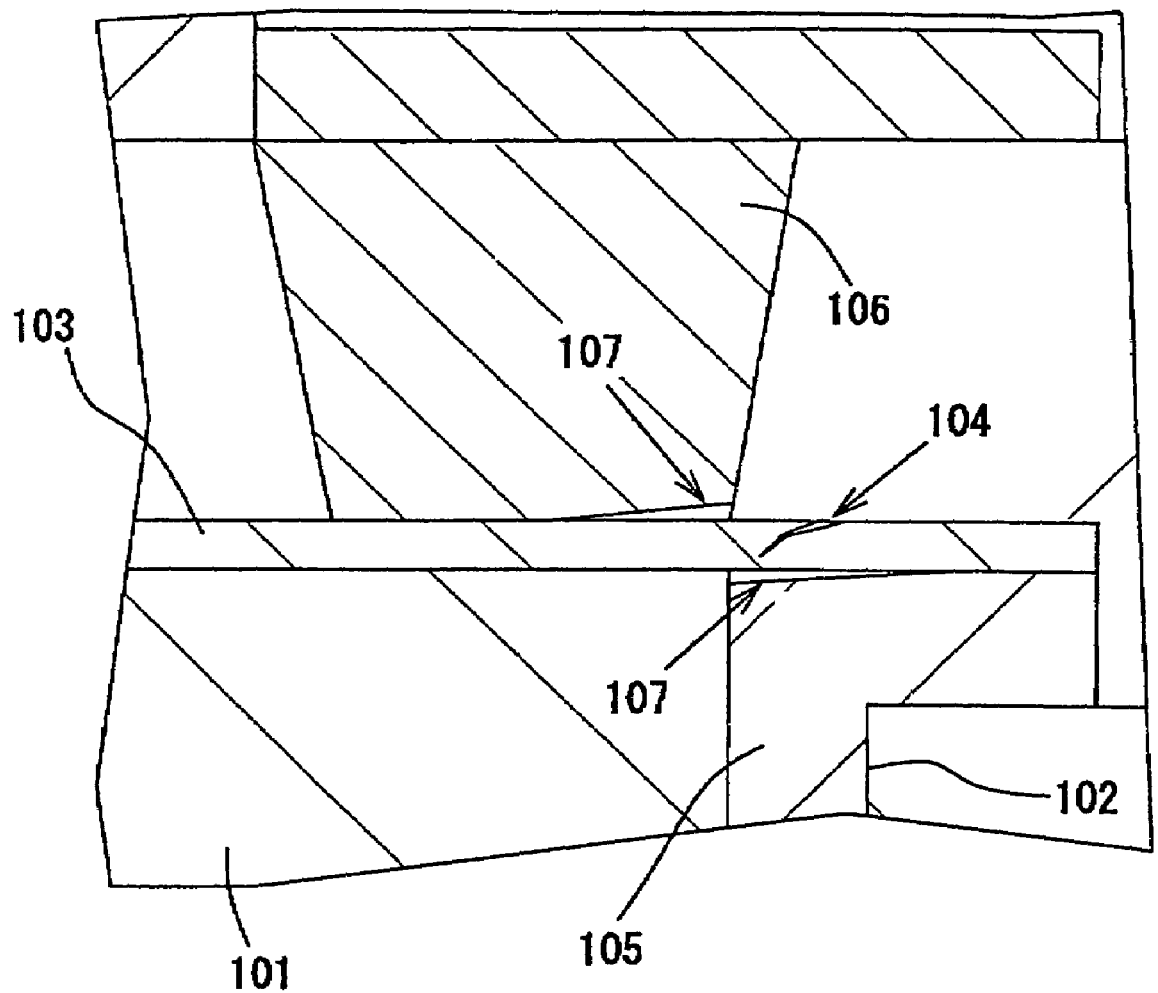
FIG. 5, which was described above, is a magnified schematic cross-sectional view of essential parts of a multilayer wiring board used in explaining problems associated with the prior art.

As shown in FIG. 1, a multilayer wiring board, which is generally denoted 11, comprises a double-sided built-up multilayer wiring board having a built-up layer on both sides. A core substrate 12 of the multilayer wiring board 11 comprises a nearly rectangular plate member, as viewed in plan, (with an exemplary thickness of 0.8 mm), having an upper surface 13 (defining a first principal plane) and a lower surface 14 (defining a second principal plane). At a plurality of positions on the core substrate 12, through-holes 15, which penetrate through the upper surface 13 and lower surface 14, are formed at equal intervals. These through-holes 15 have a through-hole plating 17 on the inner wall of penetration holes 16 opening at both the upper surface 13 and lower surface 14. In a specific embodiment, the through-hole plating 17 is formed by electrolytic copper plating after electroless copper plating, and the deposit thickness is about 20 μm. The surface of through-hole plating 17 is smooth, i.e., practically without any roughness or undulations, with a Ra less than 1 μm.

The through-holes 15 are filled with a hardened filling material 18. The filler material 18 is preferably a paste made of epoxy resin with additives such as a curing agent and filler. The details of the material composition are described below.

At the upper side opening of the through-hole 15, an upper side lid plating layer (lid conductor) 21 is formed. Similarly, at the lower side opening of the through-hole 15, a lower side lid plating layer (lid conductor) 22 is formed. As a result, the ends of the through-holes 15 are closed by these lid plating layers 21, 22.

In a specific, exemplary embodiment, the lid plating layers 21, 22 are formed by electrolytic copper plating after electroless copper plating, and their thickness (more specifically the thicknesses thereof at positions in contact with the end of the hardened filling material 18) is about 15 μm to 25 μm. In this specific embodiment, the thickness of the lid plating layers 21, 22 at positions in contact with the land of the through-holes 15 is greater, being about 35 μm to 45 μm.

A first interlayer insulating layer 31 is formed on the upper surface 13 of the core substrate 12, and a second interlayer insulating layer 32 is formed on the lower surface 14 of the core substrate 12. In a specific, exemplary embodiment, the interlayer insulating layers 31, 32 are both about 30 μm in thickness, and are composed of resin-resin composite material formed, for example, by impregnating epoxy resin in continuous porous PTFE.

A first wiring layer 23 is patterned and formed on the upper surface of interlayer insulating layer 31, i.e., on the upper surface side of core substrate 12, and a second wiring layer 24 is patterned and formed on the surface of second interlayer insulating layer 32, i.e., on the lower surface side of core substrate 12.

At specified positions of first interlayer insulating layer 31, that is, immediately above through-holes 15, via recesses 41, typically about 70 μm in diameter, are provided. Similarly, at specified positions of second interlayer insulating layer 32, that is, immediately beneath through-holes 15, via recesses 44, typically about 70 μm in diameter, are similarly provided. The via recesses 41, 44 are filled with an electrolytic copper plating which serves as the via conductor so as to form respective filled vias 43, 46. The upper filled vias 43 are connected to the lid plating layer 21 at the innermost side, while the outermost side is connected to the wiring layer 23. As a result, the through-holes 15 and wiring layer 23 are conductively connected together by way of the filled vias 43. Similarly, the lower filled vias 46 are connected to the lid plating layer 22 at the innermost side, while the outermost side is connected to the wiring layer 24. As a result, the through-holes 15 and wiring layer 24 are conductively connected together by way of the filled vias 46.

On the surface of first interlayer insulating layer 31, a further interlayer insulating layer 51 is formed, and on the surface of second interlayer insulating layer 32, a further interlayer insulating layer 52 is formed. The further interlayer insulating layers 51, 52 are both typically about 30 μm in thickness, and are composed of resin-resin composite material formed, for example, by impregnating epoxy resin in continuous porous PTFE.

On the respective surfaces of further interlayer insulating layers 51, 52, respective solder resists 71, 72 are provided.

At specified positions of further interlayer insulating layers 51, 52, via recesses 61, 64, typically about 70 μm in diameter, are provided. The via recesses 61, 64 are filled with an electrolytic copper plating as the via conductor so as to form upper and lower filled vias 63, 66, respectively.

The upper filled vias 63 are connected to the wiring layer 23 at the innermost side, while the outermost side is exposed by an opening 81 in the solder resist 71. On the outermost side of the filled via 63, a bump 83 is formed for use in providing a connection with a pad of an IC chip (not shown). Similarly, the lower filled vias 66 are connected to the wiring layer 24 at the innermost side, while the outermost side is exposed by an opening 84 in the solder resist 72. On the outermost side of the filled via 66, a bump 86 is formed for use in providing a connection with the pad of a mother board (not shown).

EXAMPLE

A more specific example of a preferred embodiment is set forth below.

Preparation of Filling Material for Filing Through-Holes 15

In accordance with the composition in Table 1 of FIG. 2, an epoxy resin, curing agent, and filler were mixed and kneaded by using a three roll mills to prepare a filling paste for the through-holes, i.e., were prepared as filling material.

The details of the materials used are as follows. In Table 1, the sum of the epoxy resin and curing agent is 100 parts, and the amount of the other components is expressed by parts by weight. Aside from the components described below, small amounts of catalyst core, thickener, and defoaming agent were added to the filling paste for through-holes.

Filling material

E-828: Bisphenol A type epoxy resin (Japan Epoxy Resin)

E-807: Bisphenol F type epoxy resin (Japan Epoxy Resin)

E-630: Aminophenol type epoxy resin (Japan Epoxy Resin)

Curing agent

2MAZ-PW: Imidazole system curing agent (Shikoku Chemical Corporation)

DICY7: Dicyan diamide system curing agent (Japan Epoxy Resin)

Filler

F1: Atomized Cu powder classified as having a mean particle size of 3 μm and a maximum particle size of 10 μm F2: Silica powder classified as having a mean particle size of 6 μm and a maximum particle size of 24 μm F3: Surface treated product of calcium carbonate powder classified as having a mean particle size of 2 μm and a maximum particle size of 10 μm Preparation of Multilayer Wiring Board 11

For fabricating the multilayer wiring board 11, the following core substrate 12 was used. Its properties are shown in Table 2 of FIG. 3.

Core Substrate

Core substrate A: BT/glass cloth composite substrate A

Core substrate B: Epoxy/glass cloth/filler composite substrate

Core substrate C: BT/glass cloth composite substrate C

In this example, penetration holes 16 of 100 μm, 200 μm, or 300 μm in diameter were first provided in the core substrate 12 (typical thickness 0.8 mm). Then, by electroless copper plating and electrolytic plating using known methods, through-hole plating 17 was formed on the inner wall of the penetration holes 16 to form through-holes 15. By printing the filling material shown in Table 1 of FIG. 2, using a known printing method, the through-holes 15 were filled with filling material.

The core substrate 12 was then heated and cured, under the conditions of 150° C. for 5 hours, to obtain the hardened filling material 18.

After this heating and curing process, the upper surface 13 and lower surface 14 of the core substrate 12 were smoothed down by grinding with a belt sander, and electroless plating and electrolytic copper plating were applied, in that order, to the entire surface of the core substrate 12 including the end face of the hardened filling material 18.

On the formed conductor layer, a dry film was placed. The film was exposed, developed and then etched to pattern the conductor layer. As a result, lid plating layers 21, 22 were formed in the opening of the through-holes 15.

Next, by using a build-up method, the after interlayer insulating layers 31, 32 (ABF-GX of Ajinomoto, having mean coefficient of thermal expansion in Z-axis direction of 55 ppm/K) were formed. The portion immediately above the through-holes 15 was drilled by a carbon dioxide gas laser. Via recesses 41, 44, formed by the drilling, were filled with electroless plating and electrolytic copper plating, in that order, to form filled vias 43, 46, and to also form wiring layers 23, 24 on the surface of the interlayer insulating layers 31, 32.

Using similar techniques, interlayer insulating layers 51, 52 were formed, and by laser drilling, electroless plating and electrolytic copper plating, filled vias 63, 66 were formed. Next, solder resists 71, 72 were formed.

Finally, by printing solder to filled vias 63, 66 exposed from the solder resists 71, 72, and by reflow, under the heating condition of 215° C. for 10 seconds, the multilayer wiring board 11 in FIG. 1 having solder bumps 83, 86 was completed. With respect to the solder material for forming solder bumps 83, 86, in this example, tin-lead eutectic solder (Sn/37Pb: melting point 183° C.) was used.

As shown in Table 3 of FIG. 4, a sample 1 is a combination of a core substrate A and a filling material F1, sample 2 is a combination of the core substrate A and the filling material F2, sample 3 is a combination of the core substrate A and a filling material F3, and sample 4 is a combination of the core substrate A and a filling material F4. Further, sample 5 is a combination of the core substrate B and a filling material F1, sample 6 is a combination of the core substrate C and a filling material F1, and sample 7 is a combination of the core substrate C and a filling material F4.

Thermal Impact Test

Using the multilayer wiring board 11 fabricated according to the discussion above, thermal impact tests were conducted employing the following procedure in order to compare the connection quality, i.e., the connection reliability. Specifically, one heating cycle is −55° C. for 5 minutes to 125° C. for 5 minutes, and this heating cycle was repeated 500 times. Next, the core substrate 12 was cut off along the axial direction of through-holes 15, and the cutting surface was observed by SEM. In the lid plating layers 21, 22, and the surrounding conductor area (e.g., the lands of through-holes 15, and the filled vias 43, 46), the occurrence of cracks and delamination was investigated. The results are shown in Table 3 of FIG. 4. Prior to the thermal impact test, no particular defects such as cracks or delamination, were discovered in the multilayer wiring board 11.

Measurement of Linear Expansion and Mean Coefficient of Thermal Expansion of Hardened Filling Material 18 and Core Substrate 12

With respect to the hardened filling material 18, the filling material was first poured into a molding die having a molding space of about 10 mm×10 mm×50 mm. The filling material was then heated and cured, under the conditions of 150° C. for 5 hours (i.e., the same conditions as in the conventional or ordinary process). By using a lathe, a circular columnar test piece of about 20 mm in diameter of 5 mm was cut out, and this sample was measured by a TMA method. That is, while applying a compressive load of about 1 g in the longitudinal direction of test piece at a span of 20 mm, the test piece was first cooled to −55° C., and then heated up to 215° C. at a heating rate of 10° C./min. In this process, at 25° C. and 215° C., the length of test piece was measured, and the measured results so obtained were used in Equation 1 above to calculate the value of linear expansion (%). Further, the length of test piece was measured at −55° C., 25° C., and 125° C., and the measured results so obtained were used in Equation 2 above to calculate the mean coefficient of thermal expansion (ppm/K). The results are shown in Tables 1 and 2 of FIGS. 1 and 2, respectively.

Regarding core substrate 12, by using a dicing machine, a square test piece was cut off having a thickness of 0.8 mm and dimensions of 5.0×5.0 mm, and this sample was measured by the TMA method. That is, while applying a compressive load of about 1 g in the thickness direction of test piece, the test piece was first cooled to −55° C., and then heated up to 215° C. at a heating rate of 10° C./min. In this process, at 25° C. and 215° C., the thickness of the test piece was measured, and the measured results so obtained were used in Equation 1 above to calculate the value of linear expansion (%). Further, the thickness of the test piece was measured at −55° C., 25° C., and 125° C., the measured results so obtained were used in Equation 2 above to calculate the mean coefficient of thermal expansion (ppm/K). The results are also shown in Tables 1 and 2 of FIGS. 1 and 2, respectively.

With respect to the linear expansion of hardened filling material 18, as shown in Table 1, for the hardened filling materials F1 and F2, the values of linear expansion were both below 1.20%, so that the values are in the favorable range. In contrast, for the hardened matter filling materials F3 and F4, the values of linear expansion exceeded 1.20%, and thus were out of the favorable range. These results hence suggest that favorable results would be obtained by selecting filling materials F1 and F2.

Considering the linear expansion and mean coefficient of thermal expansion of core substrate 12, as shown in Table 2, for the core substrates A and B, the values of linear expansion were both below 1.30%, i.e., in the favorable range. In contrast, for the core substrate C, the value of linear expansion exceeded 1.30%, which was out of the favorable range. A similar tendency was noted in the mean coefficient of thermal expansion, and, in this regard, the core substrates A and B exhibited lower values than the core substrate C. This suggests that favorable results would be obtained by selecting core substrates A and B.

With respect to the printability of filling material on core substrate 12, in samples 1, 2, 3, 5, and 6, satisfactory printability was observed even for small through-holes 15 of 100 μm in diameter. For sample numbers 4 and 7, printability was poor for small through-holes 15, and filling was insufficient. Hence, from the viewpoint of printability, better results are obtained by using filling materials F1, F2, F3, rather than using filling material F4.

Regarding connection reliability based on the thermal impact test, in samples 1, 2, and 5, wherein the diameter of through-holes 15 is 100 μm, any occurrence of cracking and delamination could be suppressed to 0%. Therefore, in the multilayer wiring board 11 of samples 1, 2, and 5, an extremely high connection reliability was exhibited in the lid plating layers 21, 22 and their surrounding conductor area. In other samples, for a diameter of through-holes 15 of 200 μm or less, cracks and delamination occurred at a high incidence rate.

In summary, the preferred embodiments discussed above provide the following effects. The value of linear expansion of the hardened filling material 18 should be kept at an extremely low value of 1.2% or less in the temperature region from room temperature (25° C.) to solder reflow temperature (215° C.). Moreover, the absolute value of the difference between the value of linear expansion of the hardened filling material 18 in the temperature region from room temperature (25° C.) to solder reflow temperature (215° C.), and the value of linear expansion in the thickness direction of the core substrate 12 in the same temperature region should be kept at an extremely low value of 0.1% or less. Therefore, at the time of solder reflow, the amount of thermal expansion of hardened filling material 18 is quite small, and the compressive or tensile stress existing in the lid plating layers 21, 22 and surrounding conductor area is also very small. Hence, even after the thermal impact test, almost no cracking and delamination occurs in the lid plating layers 21, 22 and surrounding conductor area, so that the multilayer wiring board 11 has a high connection reliability.

Although the invention has been described above in relation to preferred embodiments thereof, it will be understood by those skilled in the art that variations and modifications can be effected in these preferred embodiments without departing from the scope and spirit of the invention.

What is claimed:

1. A multilayer wiring board including solder having a solder reflow temperature and comprising:
    a core substrate having a thickness direction, a first principal plane and a second principal plane, and a plurality of through-holes, each comprising a penetration hole including an inner wall and having a diameter of no greater than 200 μm and opening at the first principal plane and second principal plane and a through-hole conductor provided on the inner wall of the penetration hole;
    an interlayer insulating layer disposed at least on one side of at least one of the first principal plane of the core substrate and the second principal plane of the core substrate;
    a wiring layer disposed on the surface of the interlayer insulating layer;
    a hardened filling material filling the through-holes and having a thickness direction; and
    a lid conductor closing at least one end of the through-holes,
    wherein the hardened filling material has a value of linear expansion that is no greater than 1.2% in a temperature region from room temperature to the solder reflow temperature and a mean coefficient of thermal expansion in the thickness direction of between 20 ppm/K and 40 ppm/K and wherein the core substrate has a mean coefficient of thermal expansion in the thickness direction of a value such that the absolute value of the difference between the mean coefficient of thermal expansion of the hardened filling material and the core substrate is no greater than 20 ppm/K.

2. The multilayer wiring board according to claim 1, wherein the through-hole conductor comprises a through-hole plating.

3. The multilayer wiring board according to claim 1, wherein the value of linear expansion in the thickness direction of the core substrate is no greater than 1.3% in a temperature region from room temperature to the solder reflow temperature.

4. The multilayer wiring board according to claim 1, wherein filled vias, comprising via recesses filled with plating, are disposed on the surface of the lid conductor.

5. The multilayer wiring board according to claim 1, wherein the filling material for filling the through-holes has a viscosity of no greater than 300 Pa·s at shearing speed of 21 $s_{-1}$ at 22+/−3° C.

6. The multilayer wiring board according to claim 1, wherein the surface of the through-hole conductor is smooth, having a Ra<1 μm.

7. The multilayer wiring board according to claim 1, wherein the filling material comprises an epoxy resin, combined with a curing agent and a filler of a maximum particle size of between 5 μm and 60 μm.

8. The multilayer wiring board according to claim 1, wherein the value of linear expansion of the hardened filling material is at least 0.3% in the temperature region from room temperature to the solder reflow temperature.

9. The multilayer wiring board according to claim 1, wherein the value of linear expansion of the hardened filling material is at least 0.8% in the temperature region from room temperature to the solder reflow temperature.

10. The multilayer wiring board according to claim 1, wherein the value of linear expansion in the thickness direction of the core substrate is between 0.3% and 1.4% in the temperature region from room temperature to the solder reflow temperature.

11. A multilayer wiring board including solder having a solder reflow temperature and comprising:
- a core substrate having a first principal plane and a second principal plane, and a plurality of through-holes each comprising a penetration hole of a diameter of no greater than 200 µm and opening on the first principal plane and second principal plane and a through-hole conductor provided on the inner wall of the penetration hole;
- an interlayer insulating layer disposed at least on one side of at least one of the first principal plane of the core substrate and the second principal plane of the core substrate;
- a wiring layer disposed on the surface of the interlayer insulating layer;
- a hardened filling material filling the through-holes; and
- a lid conductor closing at least one end of the through-holes, wherein the hardened filling material has a linear expansion value in the thickness direction that varies with temperature and is no greater than 1.2% in a temperature region from room temperature to the solder reflow temperature, and the core substrate has a linear expansion value in the thickness direction of the substrate that varies with temperature and is no greater than 1.3% in the temperature region from room temperature to the solder reflow temperature, wherein the absolute value of any difference in the linear expansion value of the hardened matter filling material in a temperature region from room temperature to the solder reflow temperature, and the linear expansion value in the thickness direction of the core substrate in the temperature region from room temperature to the solder reflow temperature is no greater than 0.1 %, and wherein said hardened filling material has a mean coefficient of thermal expansion in the thickness direction of between 20 ppm/K and 40 ppm/K and wherein the core substrate has a mean coefficient of thermal expansion in the thickness direction of a value such that the absolute value of the difference between the mean coefficient of thermal expansion of the hardened filling material and the core substrate is no greater than 20 ppm/K.

12. The multilayer wiring board according to claim 11, wherein the through-hole conductor comprises through-hole plating.

13. The multilayer wiring board according to claim 11, wherein filled vias, comprising via recesses filled with plating, are disposed on the surface of the lid conductor.

14. The multilayer wiring board according to claim 11, wherein the filling material for filling the through-holes has a viscosity of no greater than 300 Pa·s at shearing speed of 21 $s_{-1}$ at 22+/−3° C.

15. The multilayer wiring board according to claim 11, wherein the surface of the through-hole conductor is smooth, having a Ra<1 µm.

16. The multilayer wiring board according to claim 11, wherein the filling material comprises an epoxy resin, combined with a curing agent and a filler of a maximum particle size between 5 µm and 60 µm.

17. The multilayer wiring board according to claim 11, wherein the linear expansion value of the hardened filling material is between 0.3% and 1.2% in the temperature region from room temperature to the solder reflow temperature.

18. The multilayer wiring board according to claim 11, wherein the linear expansion value of the hardened filling material is between 0.8% and 1.2% in the temperature region from room temperature to the solder reflow temperature.

19. The multilayer wiring board according to claim 11, wherein the linear expansion value in the thickness direction of the core substrate is between 0.3% and 1.3% in the temperature region from room temperature to the solder reflow temperature.

* * * * *